United States Patent
Nam et al.

(10) Patent No.: US 9,267,203 B2
(45) Date of Patent: Feb. 23, 2016

(54) CONTINUOUS COATING APPARATUS

(75) Inventors: Kyung-Hoon Nam, Gwangyang-si (KR); Young-Jin Kwak, Gwangyang-si (KR); Dong-Yoeul Lee, Gwangyang-si (KR); Tae-Yeob Kim, Gwangyang-si (KR); Yong-Hwa Jung, Gwangyang-si (KR); Kyoung-Bo Kim, Gwangyang-si (KR); Woo-Sung Jung, Gwangyang-si (KR); Mun-Jong Eom, Gwangyang-si (KR); Sang-Cheol Lee, Gwangyang-si (KR); Sang-Hoon Park, Gwangyang-si (KR)

(73) Assignee: POSCO, Pohang-si (KR)

( * ) Notice: Subject to any disclaimer, the term of this patent is extended or adjusted under 35 U.S.C. 154(b) by 75 days.

(21) Appl. No.: 13/824,494

(22) PCT Filed: Dec. 13, 2010

(86) PCT No.: PCT/KR2010/008889
§ 371 (c)(1),
(2), (4) Date: Mar. 18, 2013

(87) PCT Pub. No.: WO2012/081738
PCT Pub. Date: Jun. 21, 2012

(65) Prior Publication Data
US 2013/0199447 A1 Aug. 8, 2013

(51) Int. Cl.
*H05B 6/32* (2006.01)
*C23C 14/24* (2006.01)
(Continued)

(52) U.S. Cl.
CPC .............. *C23C 16/448* (2013.01); *C23C 14/24* (2013.01); *C23C 14/246* (2013.01); *C23C 14/56* (2013.01); *H01L 51/001* (2013.01); *H01L 51/0008* (2013.01); *H05B 6/32* (2013.01)

(58) Field of Classification Search
CPC .............. C23C 14/243; C23C 14/562; C23C 14/24–14/26; C23C 14/246; C23C 16/06; H05B 6/22–6/34; F27B 14/0806; B22D 37/00; B22D 39/00–39/06; B22D 41/14–41/20; C22B 21/0084; C22B 9/055; F04D 29/026; F04D 29/2227; F04D 29/406; F04D 29/4213; F04D 29/445; F04D 29/628; F04D 29/708; F04D 7/06; F04D 7/065; F27D 2003/0054; F27D 3/14; H01L 21/02625; H01L 21/02628; H01L 21/02631; H01L 51/0008; H01L 51/001
USPC ........ 156/345.1, 345.2; 118/715, 718, 723 R, 118/726, 730; 219/648, 672; 222/591–607; 427/328, 329, 587
See application file for complete search history.

(56) References Cited

U.S. PATENT DOCUMENTS 2,664,852 A * 1/1954 Chadsey, Jr. .................. 118/718
3,059,612 A * 10/1962 Baughman et al. ........... 118/727
(Continued)

FOREIGN PATENT DOCUMENTS

| CN | 1679375 A | 10/2005 |
|---|---|---|
| JP | 59113179 | 6/1984 |

(Continued)

OTHER PUBLICATIONS

E. Reinhold et al. "Metal strip coating by electron beam PVD—industrial requirements and customized solutions," Surface & Coatings Technology 188-189 (2004) 708-713.*

(Continued)

*Primary Examiner* — Stanislav Antolin
(74) *Attorney, Agent, or Firm* — The Webb Law Firm (57) ABSTRACT

Provided is a continuous coating apparatus which can supply a liquid coating material (a molten metal) to a levitation-heating space through various paths, and can easily control a supply flow rate of the liquid coating material, and has a simplified structure. The continuous coating apparatus includes: a vacuum chamber unit through which a coating target passes; a levitation-heating unit disposed in the vacuum chamber unit and generating an evaporation vapor by vaporizing a supplied coating material; and a liquid coating material supply unit connected so that a liquid coating material is supplied to at least one of an upper portion and a lower portion of the levitation-heating unit, and communicating with the outside of the vacuum chamber unit.

11 Claims, 3 Drawing Sheets

(51) Int. Cl.
*C23C 14/56* (2006.01)
*C23C 16/448* (2006.01)
*H01L 51/00* (2006.01)

(56) References Cited

U.S. PATENT DOCUMENTS

| | | | |
|---|---|---|---|
| 3,227,132 A * | 1/1966 | Clough et al. | 118/733 |
| 3,371,186 A * | 2/1968 | Trabilcy | 392/478 |
| 3,408,224 A * | 10/1968 | Ashburn et al. | 427/250 |
| 3,815,623 A * | 6/1974 | Farmer | 137/142 |
| 4,356,940 A * | 11/1982 | Ansorge | 222/596 |
| 4,793,596 A * | 12/1988 | Kubota et al. | 222/590 |
| 4,938,276 A * | 7/1990 | Noguchi et al. | 164/133 |
| 5,002,837 A * | 3/1991 | Shimogori et al. | 428/621 |
| 5,239,611 A | 8/1993 | Weinert | |
| 5,250,103 A * | 10/1993 | Yamauchi et al. | 75/584 |
| 5,400,931 A * | 3/1995 | Holta et al. | 222/595 |
| 5,431,212 A * | 7/1995 | Arakawa et al. | 164/63 |
| 5,454,423 A * | 10/1995 | Tsuchida et al. | 164/337 |
| 5,630,464 A * | 5/1997 | Bauman et al. | 164/337 |
| 5,676,731 A * | 10/1997 | Hitchings | 75/407 |
| 6,273,308 B1 * | 8/2001 | Choshi | 222/596 |
| 6,578,620 B1 * | 6/2003 | Trudel et al. | 164/312 |
| 7,323,229 B2 * | 1/2008 | Schade Van Westrum et al. | 427/561 |
| 7,973,267 B2 * | 7/2011 | Priede et al. | 219/648 |
| 2002/0084054 A1 * | 7/2002 | Trudel et al. | 164/316 |
| 2004/0022942 A1 * | 2/2004 | Schade van Westrum et al. | 427/248.1 |
| 2004/0026234 A1 * | 2/2004 | Vanden Brande et al. | 204/192.12 |
| 2004/0139914 A1 | 7/2004 | Yamazaki et al. | |
| 2004/0191097 A1 * | 9/2004 | Nakagawa et al. | 417/454 |
| 2005/0064110 A1 * | 3/2005 | Schade Van Westrum et al. | 427/591 |
| 2005/0229856 A1 * | 10/2005 | Malik | 118/726 |
| 2006/0214338 A1 * | 9/2006 | Hauser | 266/240 |
| 2007/0074844 A1 * | 4/2007 | Rapp | 164/336 |
| 2008/0190908 A1 * | 8/2008 | Priede et al. | 219/385 |
| 2008/0190970 A1 * | 8/2008 | Sanders | 222/593 |
| 2008/0203629 A1 * | 8/2008 | Mizuno et al. | 266/160 |
| 2008/0280066 A1 * | 11/2008 | Schade Van Westrum et al. | 427/569 |
| 2009/0014412 A1 | 1/2009 | Nozawa et al. | |
| 2010/0104752 A1 | 4/2010 | Choquet et al. | |
| 2010/0170439 A1 | 7/2010 | Negishi | |
| 2011/0000431 A1 * | 1/2011 | Banaszak et al. | 118/694 |
| 2013/0186339 A1 * | 7/2013 | Nam et al. | 118/726 |

FOREIGN PATENT DOCUMENTS

| | | | | |
|---|---|---|---|---|
| JP | 59113179 A * | 6/1984 | | C23C 13/12 |
| JP | 59-177370 | 10/1984 | | |
| JP | 59177370 A * | 10/1984 | | C23C 13/12 |
| JP | 06-093430 | 4/1994 | | |
| JP | 10-008240 | 1/1998 | | |
| JP | 10008240 A * | 1/1998 | | C23C 14/24 |
| JP | 11128719 A | 5/1999 | | |
| JP | 2006111926 A | 4/2006 | | |
| JP | 2007-227086 A | 9/2007 | | |
| JP | 2009084665 A | 4/2009 | | |
| JP | 2010-522272 A | 7/2010 | | |
| KR | 100926437 B1 | 11/2009 | | |
| WO | WO 2005116290 A1 * | 12/2005 | | C23C 14/56 |
| WO | 2006021245 A1 | 3/2006 | | |
| WO | 2006/088067 A1 | 8/2006 | | |
| WO | WO 2006088068 A1 * | 8/2006 | | |
| WO | WO 2009047333 A1 * | 4/2009 | | |
| WO | 2010056057 A2 | 5/2010 | | |

OTHER PUBLICATIONS

L. Baptiste et al., "Electromagnetic Levitation: A New Technology for High Rate Physical Vapour Deposition of Coatings onto Metallic Strip," Surface & Coatings Technology 202 (2007) 1189-1193.*

* cited by examiner

CONTINUOUS COATING APPARATUS

TECHNICAL FIELD

The present invention relates to a continuous coating apparatus, and more particularly, to a continuous coating apparatus which can perform high-speed coating on a substrate (a metal strip) which is a moving coating target. In particular, the present invention relates to a continuous coating apparatus which can supply a liquid coating material (a molten metal) to a levitation-heating space through various paths, can easily control a supply flow rate of the liquid coating material, and has a simplified structure.

BACKGROUND ART

A molten metal can be coated on a substrate, e.g., a continuously moving substrate (a metal strip), in a vacuum environment through known evaporation methods.

For example, techniques for changing a solid coating material into vapor by heating and vaporization and coating (evaporating) the vapor on a substrate are classified depending on a heating method. Representative examples of vacuum evaporation techniques include thermal evaporation, electron beam evaporation, electromagnetic levitation evaporation, and so on.

As for the thermal evaporation technique, a coating material is resistively heated and vaporized and is then coated on a substrate. However, the thermal evaporation technique has a limit to the heating of the coating material using resistance heating. Since it is difficult to coat high melting point materials, such as titanium (Ti) or chromium (Cr) with the thermal evaporation technique, this technique has been applied to the coating of low melting point materials as zinc or magnesium (Mg).

In addition, the thermal evaporation technique has a limit to a coating speed thereof. For example, the coating speed of magnesium is a mere 30 μm·m/min.

As for the electron beam evaporation technique, a solid coating material is loaded into a crucible and is locally heated by an electron beam. In this manner, high melting point materials are vaporized and coated. However, heat loss caused by contact between the vaporized material and the crucible reduces the energy efficiency and coating speed thereof. For example, the coating speed of aluminum is merely 20 μm·m/min.

Meanwhile, other evaporation techniques are disclosed in PCT International Publication No. WO 2006/021245 (Korean Patent Application No. 2007-7006446) or U.S. Patent Publication No. 2005/0064110.

Specifically, a coating material is heated to a levitation state through an alternating electromagnetic field which is generated when a high-frequency alternating current is applied to an electromagnetic coil enclosing the coating material. Thus, metal (coating) vapors are generated and coated on a substrate, without heat loss caused by a crucible.

However, the PCT International Publication (the Korean Patent Application) suggests only the basic concept of coating through levitation and heating by the alternating electromagnetic field. In the case of the U.S. Patent Publication, a substrate is coated in such a state that a vaporization space is vacuum-isolated. However, since a coating material is supplied through a solid wire feeder, a supply path (position) of a wire, which is a coating material, is limited to only a lateral side (a horizontal direction).

Furthermore, in the case of the U.S. Patent Publication, a solid wire is supplied to a space where an alternating electromagnetic field is formed, and is then levitated and heated. Thus, as compared to a liquid material, the speed of coating by the solid wire is reduced or the cost thereof is increased due to the increase in heating load.

An aspect of the present invention provides a continuous coating apparatus which can perform a high-speed coating on a substrate (a metal strip) which is a moving coating target, and in particular, can supply a liquid coating material (a molten metal) to a levitation-heating space through various paths.

An aspect of the present invention also provides a continuous coating apparatus which can easily control a supply flow rate of the liquid coating material, can improve coating workability and precision, and has a simplified structure.

SUMMARY OF THE INVENTION

According to an aspect of the present invention, there is provided a continuous coating apparatus including: a vacuum chamber unit through which a coating target passes; a levitation-heating unit disposed in the vacuum chamber unit and generating an evaporation vapor by vaporizing a supplied coating material; and a liquid coating material supply unit connected so that a liquid coating material is supplied to at least one of an upper portion and a lower portion of the levitation-heating unit, and communicating with the outside of the vacuum chamber unit.

The levitation-heating unit may include one or more electromagnetic coils which levitate and heat the supplied coating material by an electromagnetic force and generate the evaporation vapor.

The liquid coating material supply unit may include: a crucible disposed outside the vacuum chamber and storing the liquid coating material; and a coating material supply pipe connected between the crucible and the levitation-heating unit disposed inside the vacuum chamber unit.

The continuous coating apparatus may further include a vapor guide unit connected to the liquid coating material supply unit inside the vacuum chamber unit and enclosing at least a portion of the levitation-heating unit, so that the evaporation vapor generated from the inside thereof is guided and sprayed to the coating target.

The vapor guide unit may include: an evaporation vapor generation section supplying the liquid coating material to the inside thereof and enclosing the levitation-heating unit, the coating material supply pipe provided in the liquid coating material supply unit being connected to one of an upper portion and a lower portion of the evaporation vapor generation section; at least an evaporation vapor nozzle section of a vapor guide section connected to the evaporation vapor generation section, and the evaporation vapor nozzle section connected to the evaporation vapor generation section or the vapor guide section; the evaporation vapor nozzle section including an evaporation vapor spray opening formed in correspondence with the width of the coating target.

The evaporation vapor generation section and the vapor guide section of the vapor guide unit may be provided in a tube form, the evaporation vapor generation unit may be made of an electrically nonconductive material, and at least one of the vapor guide section and the evaporation vapor nozzle section of the vapor guide unit is connected to a heating unit.

The continuous coating apparatus may further include a filter member disposed in the vicinity of the evaporation vapor spray opening provided in the evaporation vapor nozzle section so that the evaporation vapor passes therethrough, the filter member being made in a fabric structure by using a heat-resistant metal or ceramic material.

The continuous coating apparatus may further include at least one of: a valve unit provided in the coating material supply pipe; and a dipping-type valve unit including an opening/closing member provided at a lower portion of an elevating member, a portion of which is dipped into the coating material stored in the crucible, so that the dipping-type valve unit controls an opening/closing degree of the coating material supply pipe, whereby the supply flow rate of the coating material is controlled.

The continuous coating apparatus may further include heating units which are respectively connected to the crucible and the supply pipe provided in the liquid coating material supply unit.

The coating target may be provided in a form of a substrate continuously passing through the vacuum chamber, and the liquid coating material may be provided in a form of a molten metal.

The heating unit disposed at the vapor guide unit or the heating unit disposed at the supply pipe may be spaced apart by at least once a distance equal to the inner diameter or at least twice a distance equal to the inner radius of the electromagnetic coil disposed to be adjacent thereto and wound.

Advantageous Effects of Invention

According to exemplary embodiments of the invention, the evaporation vapor generated by using the electromagnetic force in the vacuum environment is coated on the continuously moving substrate (a metal strip), and the evaporation vapor is generated by supplying the liquid coating material (molten metal) to the levitation-heating space, as opposed to the conventional method which supplies the solid coating material such as wires. Thus, the time necessary to generate the coating vapor can be reduced, and the costs can be reduced.

In addition, the supply of the molten metal and the vapor generation using the levitation-heating can be effectively realized. The substrate can be coated at a high speed, and the coating speed thereof can be stably maintained.

In particular, the molten metal can be supplied to the electromagnetic coils through various paths. The supply flow rate of the liquid coating material (molten metal) can be easily controlled. Hence, workability and coating precision can be improved, and the continuous coating apparatus can be simplified.

BEST MODE FOR CARRYING OUT THE INVENTION

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

Figure 1:
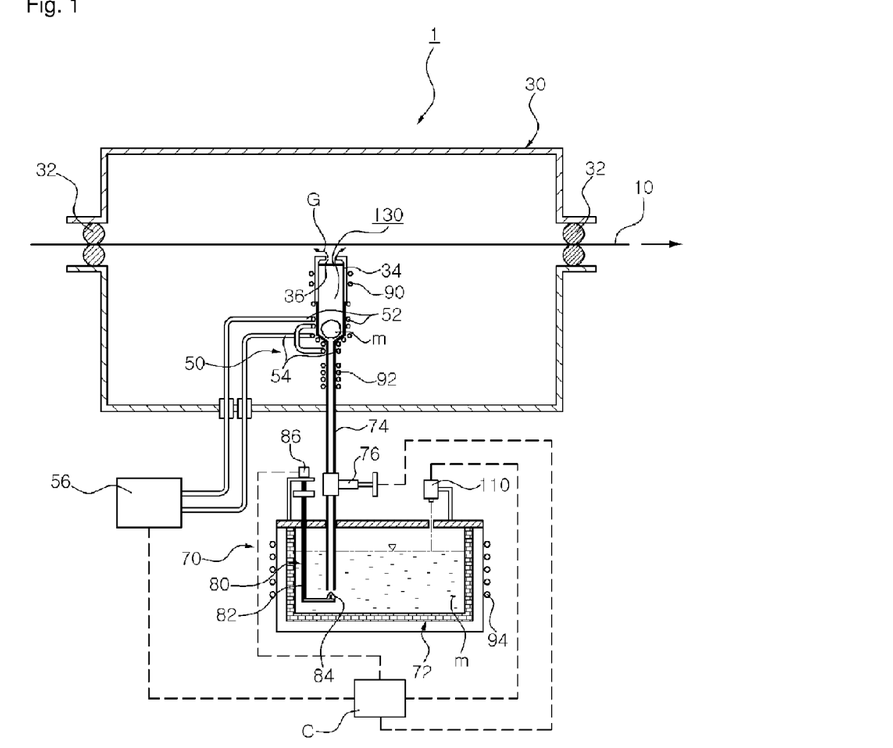
FIG. 1 is an entire configuration diagram of a continuous coating apparatus according to an embodiment of the present invention.

FIG. 1 is an entire configuration diagram of a continuous coating apparatus according to an embodiment of the present invention. Hereinafter, it is assumed that a coating target is a substrate 10 which continuously passes through a vacuum chamber unit, and a liquid coating material is a molten metal m. In this case, the substrate 10 may be a continuously moving metal strip.

Although it is illustrated in FIG. 1 that only the bottom surface of the substrate 10 is coated, the continuous coating apparatus may also be configured so that the top and bottom surfaces of the substrate 10 are simultaneously coated in a single vacuum chamber by connecting an upper levitation-heating unit 50 and a supply pipe 74 communicating with a crucible 72 of a supply unit 70.

In addition, although not illustrated, two vacuum chamber units may be connected together and lines may be provided such that the bottom surface and the top surface of the substrate 10 (or the top surface and the bottom surface thereof) are sequentially coated.

For example, as illustrated in FIG. 1, the continuous coating apparatus 1 according to the embodiment of the present invention may include a vacuum chamber unit 30 through which a coating target passes, a levitation-heating unit 50 disposed within the vacuum chamber unit 30 to vaporize a supplied coating material and generate an evaporation vapor, and a liquid coating material supply unit 70 connected so that a liquid coating material is supplied to at least one of an upper portion and a lower portion of the levitation-heating unit 50, and communicating with the outside of the vacuum chamber unit 30.

Figure 3:
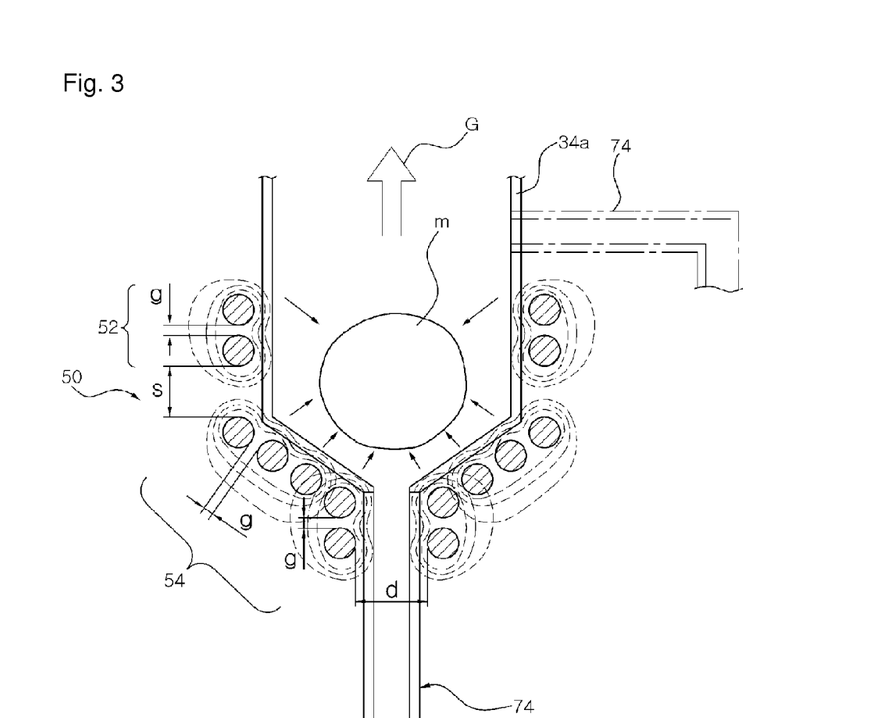
FIG. 3 is a configuration diagram of a levitation-heating unit in the continuous coating apparatus according to the embodiment of the present invention.

Therefore, in the use of the continuous coating apparatus according to the embodiment of the present invention, the continuously moving substrate 10 passes through the vacuum chamber unit 30, and a molten metal m supplied from the molten metal supply unit 70 is continuously heated and levitated by the levitation-heating unit 50 and is generated as an evaporation (metal) vapor (G in FIGS. 1 and 3).

The generated evaporation vapor may be a single component such as zinc (Zn) vapor, or an alloy component such as a zinc-magnesium (Zn—Mg) vapor. The evaporation vapor is continuously evaporated onto the moving substrate 10, thereby achieving a continuous coating.

At this time, as illustrated in FIG. 1, the inside of the vacuum chamber unit 30 according to the embodiment of the present invention is maintained in a vacuum environment by a vacuum pump (not shown), and guide rolls 32 are installed in the front and rear of the vacuum chamber unit 30. The guide rolls 32 support the continuous movement of the substrate 10 and seal an inlet and an outlet which are opened to allow the substrate 10 to pass through the vacuum chamber unit 30.

Figure 5:
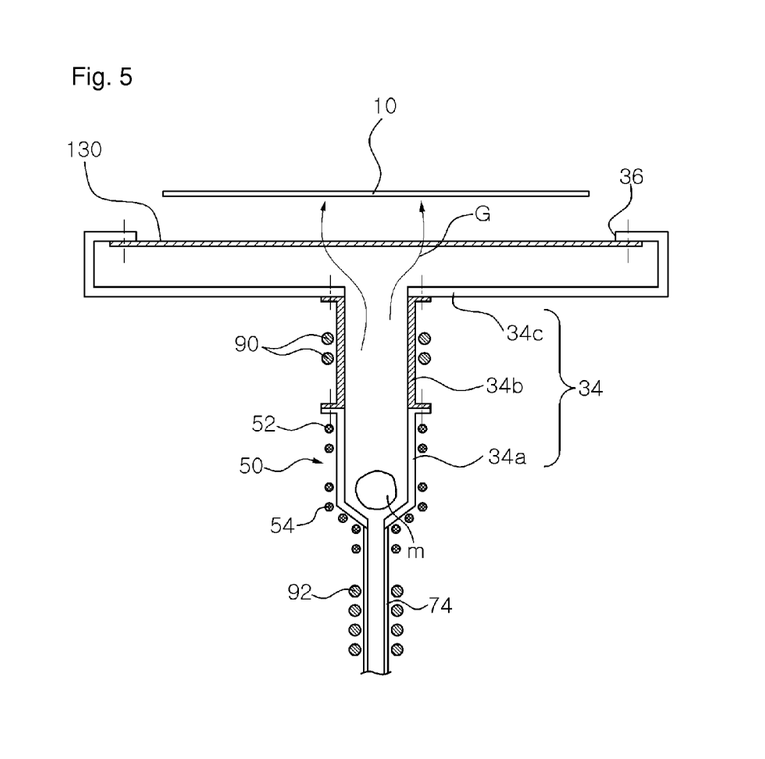
FIG. 5 is a detailed configuration diagram of a vapor guide unit according to an embodiment of the present invention.

In addition, as illustrated in FIGS. 1 and 5, the continuous coating apparatus 1 according to the embodiment of the present invention may further include a vapor guide unit 34 inside the vacuum chamber unit 30. The vapor guide unit 34 communicates with the liquid molten metal supply unit 70 and encloses at least a portion of the levitation-heating unit 50. The vapor guide unit 34 guides the evaporation vapor G to be sprayed toward the substrate 10.

As illustrated in FIGS. 1 and 5, when the evaporation vapor G is generated by heating and vaporizing the supplied molten metal m through the levitation-heating unit 50 enclosed by the vapor guide unit 34, the evaporation vapor G is guided to the substrate 10 passing through the vacuum chamber unit 30 and is evaporated on the substrate 10. Hence, the coating of the substrate is effectively realized.

Therefore, in the continuous coating apparatus 1 according to the embodiment of the present invention, the vapor guide unit 34 serves as a guide pipe which prevents the dispersion of the evaporation vapor G, which is generated by levitating and heating the supplied molten metal m by the electromagnetic force of electromagnetic coils of the levitation-heating unit 50, which will be described later in detail, and is finally evaporated onto the substrate 10. The vapor guide unit 34 achieves the spraying of the evaporation vapor G toward the substrate 10 and the evaporation on the substrate 10 through a spray opening (a nozzle opening) 36 disposed at the upper portion thereof.

Although the vapor guide unit 34 according to the embodiment of the present invention is schematically illustrated in FIG. 1, the vapor guide unit 34 may have a T shape in correspondence with the width of the substrate 10, when viewed from the front, as illustrated in FIG. 5.

That is, as illustrated in FIG. 5, the vapor guide unit 34 according to the embodiment of the present invention includes an evaporation vapor generation section 34a which is supplied with the molten metal m and encloses the levitation-heat unit 50. The molten metal supply pipe 74 provided in the molten metal supply unit 70 may be connected to either or both of a lower portion and an upper portion (not shown) of the evaporation vapor generation unit 34a. Hence, the liquid coating material, i.e., the molten metal m, may be supplied through various supply paths.

In addition, the vapor guide unit 34 according to the embodiment of the present invention may include a vapor guide section 34b connected to the upper portion of the evaporation vapor generation unit 34a, and an evaporation vapor nozzle section 34c connected to the upper portion of the evaporation vapor generation section 34a or the vapor guide section 34b. The evaporation vapor nozzle section 34c includes an evaporation vapor spray opening 36 elongated in correspondence with the width of the substrate 10.

In the vapor guide unit 34, the evaporation vapor generation section 34a, the vapor guide section 34b, and the evaporation vapor nozzle section 34c may be integrally provided or may be assembled in a flange structure.

As illustrated in FIG. 5, the evaporation vapor generation section 34a and the vapor guide section 34b of the vapor guide unit 34 may be provided in a tube form. In the evaporation vapor nozzle section 34c, the spray opening 36 may be provided in a pipe structure or a casing structure having a rectangular cross-section which is substantially equal to that of the substrate 10 to be coated.

Meanwhile, as illustrated in FIGS. 1 and 5, the spray opening 36 formed in the evaporation vapor nozzle section 34c may be opened in an integrated slit shape, or, although not illustrated, a plurality of (circular or rectangular) holes may be formed in a predetermined pattern.

The evaporation vapor generation section 34a, which is the levitation-heating space in which the molten metal m being the supplied coating material is levitated and heated, may be made of an electrically nonconductive material, for example, a ceramic.

In addition, as illustrated in FIG. 5, the vapor guide section 34b and the vapor nozzle section 34c of the vapor guide unit 34 according to the embodiment of the present invention may be connected to a heating unit 90, e.g., a heater, in order that the evaporation vapor G passing through the inside thereof can be easily coated on the substrate 10.

Meanwhile, although the heating unit 90 is provided to enclose the outside of the guide section 34b as illustrated in FIG. 5, the heating unit 90 may also be provided at the inside thereof.

In this case, the heating unit 90, i.e., the heater, which is connected to the evaporation vapor guide section 34b, may be spaced apart by at least once a distance equal to the inner diameter or at least twice a distance equal to the inner radius of the first electromagnetic coil 52 provided at the upper portion of the levitation-heating unit 50, in order to prevent the heating unit 92, i.e., the heater, from being overheated by the influence of the electromagnetic force upon the levitation-heating process.

Figure 2:
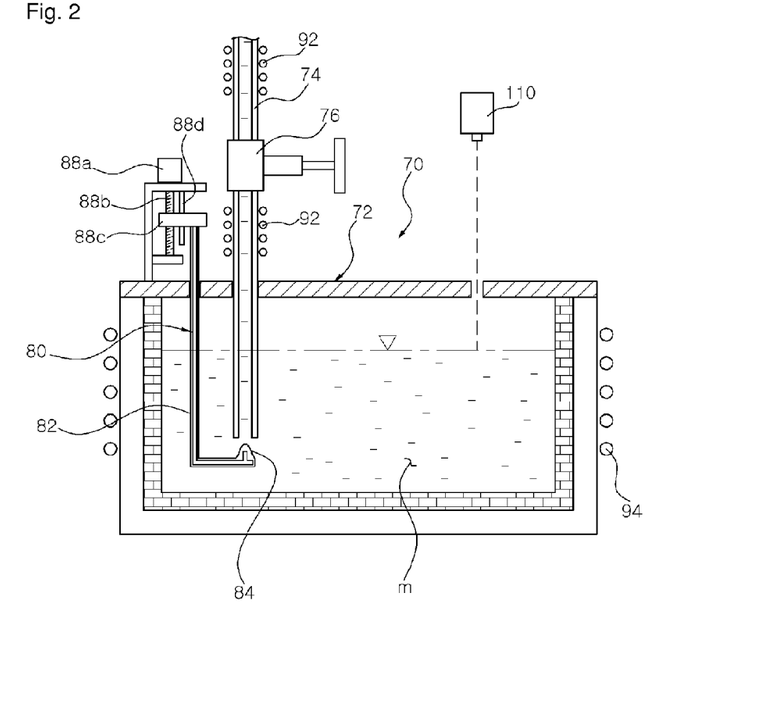
FIG. 2 is a detailed configuration diagram of a supply unit in the continuous coating apparatus according to the embodiment of the present invention.

As illustrated in FIGS. 1 and 2, the molten metal supply unit 70 of the continuous coating apparatus 1 may include a crucible 72 and a molten metal supply pipe 74. The crucible 72 is disposed outside the vacuum chamber unit 30 and stores the coating material, i.e., the molten metal m. The molten metal supply pipe 74 is connected between the crucible 72 and the vapor guide unit 34 enclosing the levitation-heating unit 50 disposed inside the vacuum chamber unit 30.

Meanwhile, although schematically illustrated, the solid metal is supplied to the crucible 72 and heated therein. Then, the liquid molten metal m is stored in the crucible 72. The liquid molten metal m is continuously supplied to the levitation-heating unit 50.

The lower portion of the molten metal supply pipe 74 is dipped into the molten metal m stored in the crucible 72, and the upper portion of the molten metal supply pipe 74 is connected to the vapor guide unit 34 disposed inside the vacuum chamber unit 30. Consequently, since the vacuum chamber unit 30 is in a vacuum environment and the crucible 72 is in an atmospheric environment, a pressure difference of about 1 bar occurs between the vacuum and the atmosphere. Due to the pressure difference, the molten metal m is supplied to the evaporation vapor generation section 34a of the vapor guide unit 34.

Meanwhile, in order to maintain the temperature of the molten metal m, known heating units 92 and 94, such as a heater or a high-frequency induction heater, may be disposed to be adjacent to the molten metal supply pipe 74 and the crucible 72 of the molten metal supply unit 70.

As illustrated in FIG. 5, the heating unit 92, i.e., the heater, which is connected to the molten metal supply pipe 74 adjacent to the second electromagnetic coil 54 of the levitation-heating unit 50, may be spaced apart by at least once a distance equal to the inner diameter (d in FIG. 3) or at least twice a distance equal to the inner radius of the lowermost portion wound by the second electromagnetic coil 54 disposed at the lower portion of the levitation-heating unit 50, in order to prevent the heating unit 92, i.e., the heater, from being overheated by the influence of the electromagnetic force upon the levitation-heating process.

Therefore, the molten metal m is stored in the crucible 72 in a molten state. As described above, due to the pressure difference between the vacuum and the atmosphere, the crucible 72 and the supply pipe 74 can be maintained at an appropriate temperature while the molten metal m is being supplied to the evaporation vapor generation section 34a of the guide unit 34 through the supply pipe 74.

As illustrated in FIG. 1, a valve unit 76 may be installed in the supply pipe 74. The valve unit 76 may include an on/off valve which closes the supply pipe 74 when the vacuum environment is formed in the vacuum chamber, or a flow rate control valve which is opened or closed to control a supply amount of the molten metal m. In FIG. 1, the valves are not indicated by separate reference symbols.

Therefore, the amount of the molten metal supplied due to the pressure difference between the vacuum and the atmosphere may be adjusted by the on/off valve or the flow rate control valve, and the on/off valve closes the pipe when the initial vacuum environment is formed in the vacuum chamber.

In addition, as illustrated in FIGS. 1 and 2, a dipping-type (flow rate control) valve unit 80 may be provided in the crucible 72 of the molten metal supply unit 70 according to the embodiment of the present invention.

For example, as illustrated in FIG. 1, the dipping-type valve unit 80 may include an elevating arm 82 and an opening/closing member 84. The elevating arm 82 moves up and down by a driving cylinder 86 or an electric actuator provided at a bracket on the crucible 72, and is dipped into the molten metal m. The opening/closing member 84 moves toward the molten metal inlet of the supply pipe 74 at the lower portion of the elevating arm 82.

Therefore, the elevating arm 82 moves up and down according to the operation of the driving cylinder. The opening/closing member 84 of which a lower portion protrudes vertically adjusts the inlet opening/closing degree of the lower portion of the supply pipe 74 according to the elevating degree of the elevating arm 82. Hence, the supply amount of the molten metal m can be controlled.

In addition, as illustrated in FIG. 2, a screw bar 88b is connected to and driven by a driving motor 88a installed at the bracket on the crucible 72. The elevating arm 82 may be connected to a moving block 88c of the dipping-type valve unit 80. An adjacent guide rod 88d passes through the moving block 88c and is supported thereby.

Therefore, the moving block 88c connected to the screw bar 88b is supported by the guide rod and is elevated according to the operation of the driving motor 88a. The elevating arm 82 and the opening/closing member 84 disposed thereunder opens/closes the inlet of the supply pipe 74 while integrally moving up and down according to the elevation of the moving block 88c. Therefore, even in the case of FIG. 2, the supply amount of the molten metal m can be smoothly adjusted.

As in the case of FIG. 2, the elevating structure in which the motor-driven screw bar 88b is connected to the moving block 88c in which the elevating arm 82 is connected to the screw bar 88b is complicated, as compared to the structure of FIG. 1 in which the cylinder 86 (or the actuator) is used. However, the opening/closing of the supply pipe 74 can be more precisely controlled through the elevating range control of the elevating arm 82.

Meanwhile, the continuous coating apparatus according to the embodiment of the present invention reduces heating load because it supplies the liquid material, i.e., the molten metal, instead of the solid material, i.e., the wire, upon the levitation-heating process. Thus, the evaporation vapor can be generated more smoothly and the costs can be further reduced.

In the continuous coating apparatus 1 according to the embodiment of the present invention, the structure of the molten metal supply unit 70 uses the dipping-type valve units which use the pressure difference and can control the supply flow rate. Therefore, the entire structure of the continuous coating apparatus can be simplified, and the substrate coating workability or precision can be at least maintained or improved.

Figure 4:
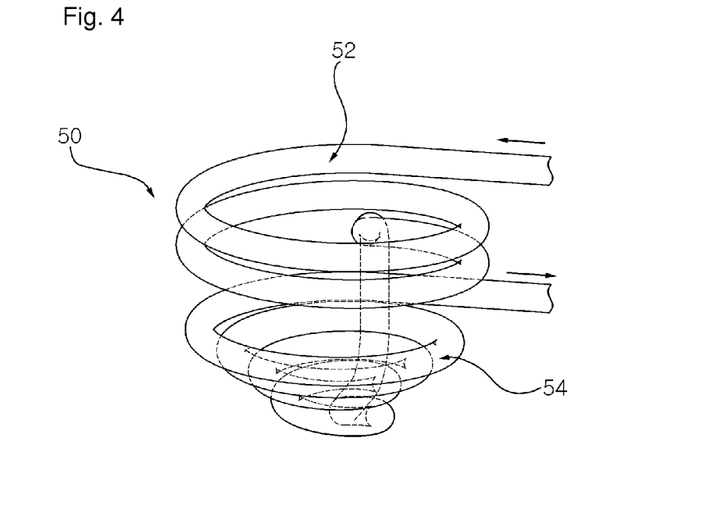
FIG. 4 is a configuration diagram of electromagnetic coils in the levitation-heating unit of FIG. 3.

As illustrated in FIGS. 3 and 4, in the continuous coating apparatus 1 according to the embodiment of the present invention, the levitation-heating unit 50 which can generate the evaporation vapor G by levitating and heating the molten metal m may include the first and second electromagnetic coils 52 and 54 enclosing the evaporation vapor generation section 34a of the vapor guide unit 34 disposed inside the vacuum chamber unit 30.

The first and second electromagnetic coils 52 and 54 of the levitation-heating unit 50 according to the embodiment of the present invention generate a strong induced eddy current in the supplied molten metal m by the interaction of a magnetic field between the electromagnetic coils, generated by a high frequency power applied through an AC power supply 56 connected thereto, and an induced current generated therein. Thus, as illustrated in FIG. 3, the supplied molten metal m is heated at a sufficient high temperature in a levitated state and is then vaporized and generated as the evaporation vapor G.

That is, a high-frequency alternating current of about 1-1,000 kHz may be applied to the first and second electromagnetic coils 52 and 54 through the AC power supply 56, and the electromagnetic force is generated in the electromagnetic coils by the applied high-frequency alternating current. The molten metal m supplied therein is levitated by the Lorentz force, heated at a high temperature by an induction heating principle, and generated as the evaporation vapor.

As illustrated in FIGS. 3 and 4, the first and second electromagnetic coils 52 and 54 of the levitation-heating unit 50 may be spaced apart by a predetermined interval S. The first electromagnetic coil 52 may be formed in a cylindrical shape in order to smoothly discharge the evaporation vapor (metal vapor) (G in FIG. 3).

The second electromagnetic coil 54 may be formed in a conical shape, which is gradually narrowed downwardly, in order to increase the levitation force of the molten metal and stably maintain the levitation heating. For example, the second electromagnetic coil 54 may be formed in a 'Y' shape or a 'V' shape.

In this case, since the lowermost inner diameter d of the second electromagnetic coil 54 is smaller than the inner diameter of the first electromagnetic coil 52 disposed above the second electromagnetic coil 54, the levitation force is increased at the second electromagnetic coil 54.

However, although not illustrated in a separate drawing, both of the first and second electromagnetic coils 52 and 54 may be formed to have a cylindrical shape.

In particular, as illustrated in FIG. 3, since the molten metal supply pipe 74 supplies the molten metal m in such a state that it is connected to either or both of the upper portion and the lower portion of the evaporation vapor generation section 34a of the vapor guide unit 34 enclosing the first and second electromagnetic coils 52 and 54 of the levitation-heating unit 50, more various molten metal supply paths are provided, as opposed to the conventional art in which the supply of the solid wire is limited to the lateral direction (the horizontal direction). Hence, the setting of the apparatus, the space utilization, or the coating workability can be improved.

That is, as illustrated in FIG. 3, at least two upper and lower supply paths can be implemented which connect the molten metal supply pipe 74 to the lower portion of the evaporation vapor generation section 34a of the vapor guide unit 34 through the lower center of the second electromagnetic coil 54, or connect the upper portion of the first electromagnetic coil 52 to the upper portion of the evaporation vapor generation section 34a.

In this case, as illustrated in FIG. 4, the first electromagnetic coil 52 disposed at the upper portion of the levitation-heating unit 50 and the second electromagnetic coil 54 disposed at the lower portion of the levitation-heating unit 50 may be wound in an opposite direction to each other. Since the current flows in the opposite direction, an offset of magnetic field is generated within the coils and the molten metal is more stably levitated.

It is suitable that the gap (g in FIG. 3) between the first electromagnetic coil 52 and the second electromagnetic coil 54 be narrow to some extent in terms of the increase in the heat generation. However, if the gap between the first electromagnetic coil 52 and the second electromagnetic coil 54 is excessively narrow, excessive heat is generated. Thus, it is suitable that the first electromagnetic coil 52 and the second electromagnetic coil 54 be spaced apart from each other by an appropriate interval.

In addition, as illustrated in FIGS. 3 and 4, the first and second electromagnetic coils 52 and 54 may be wound to have the same center line. In this case, the levitation position of the supplied molten metal m may be adjusted to the center of the first and second electromagnetic coils 52 and 54.

Meanwhile, although not illustrated in a separate drawing, both of the first and second electromagnetic coils 52 and 54 may be wound in a cylindrical shape.

Next, as illustrated in FIGS. 1 and 5, a filter member 130 may be provided in the vicinity of the evaporation vapor spray opening 36 provided at the evaporation vapor nozzle section 34c of the vapor guide unit 34.

For example, the filter member 130 may be provided in the vicinity of the evaporation vapor nozzle section 34c, for example, at the inside or outside of the spray opening or on the opening line in which the spray opening is formed. The filter member 130 serves to remove an aggregation which may be contained in the generated evaporation vapor.

That is, the filter member 130 may be disposed in the vicinity of at least the spray opening 36, and it may be disposed on the moving path of the evaporation vapor before the evaporation vapor is evaporated onto the substrate.

Since the high-temperature evaporation vapor G passes through the filter member 130, it may be provided in a fabric structure (a mesh structure) using a heat-resistant metal or a ceramic material. For example, the filter member 130 may be provided by weaving wires made of a metal or ceramic material resistant to high temperature.

Therefore, vapor aggregation is removed when the evaporation vapor passes through the filter member 130. Vapor aggregation which does not pass through the filter member 130 is molten at high temperature and is again vaporized. The filter member 130 makes it possible to uniformly coat film on the substrate.

Next, as illustrated in FIG. 1, a level detection sensor 110 detecting the level of the coating material stored in the crucible 72, that is, the molten metal, may be disposed. The level detection sensor 110, the valve unit 76 and the driving cylinder 86 (or the electric driving actuator) of the dipping-type valve unit 80, or the screw bar driving motor 88a of FIG. 2, and the AC power supply 56 of the levitation-heating unit 50 may be controlled in electrical connection to an apparatus control unit C and controlled.

In this case, the apparatus control unit C may control the valves and precisely control the supply amount of the molten metal in interconnection to the level detection sensor, and can control the alternating current applied to the first and second electromagnetic coils 52 and 54 of the levitation-heating unit 50.

Although not illustrated in a separate drawing, the apparatus control unit C can control the heating temperature in electrical connection to the heating units 90, 92 and 94.

In addition, the apparatus control unit C receives a signal from a sensor (not shown) detecting a transfer speed of a substrate to be coated, and controls an amount of the evaporation vapor to be coated on the substrate through the above-described interconnection configuration, thereby achieving the optimum continuous coating and the high-speed coating.

Industrial Applicability

Thus, the present invention provides the continuous coating apparatus which can perform a high-speed coating on a substrate metal strip which is the moving coating target (the metal strip), and in particular, can supply a liquid coating material (a molten metal) to a levitation-heating space through various paths.

The present invention also provides the continuous coating apparatus which can easily control a supply flow rate of the liquid coating material, and can improve coating workability and precision, and has a simplified structure.

The invention claimed is:

1. A continuous coating apparatus comprising:
   a vacuum chamber unit through which a coating target passes;
   a levitation-heating unit disposed inside of the vacuum chamber unit and generating an evaporation vapor by vaporizing a supplied coating material; and
   a liquid coating material supply unit comprising:
      a crucible disposed outside of the vacuum chamber unit and storing the liquid coating material;
      a coating material supply pipe wherein the coating material supply pipe is connected between the crucible and the levitation-heating unit so that the liquid coating material is supplied to at least one of an upper portion and a lower portion of the levitation-heating unit disposed inside the vacuum chamber unit, and communicating with the crucible disposed outside of the vacuum chamber unit;
      a vapor guide unit connected to the liquid coating material supply unit inside the vacuum chamber unit;
      a second heating unit provided in the vapor guide unit in addition to the levitation-heating unit; and
   a dipping-type valve unit including an opening/closing member provided in the crucible at a lower portion of an elevating member, so that the dipping-type valve unit controls an opening/closing degree of the inlet of the coating material supply pipe disposed in the liquid coating material stored in the crucible, whereby the supply flow rate of the coating material is controlled.

2. The continuous coating apparatus of claim 1, wherein the levitation-heating unit comprises one or more electromagnetic coils which levitate and heat the supplied coating material by an electromagnetic force and generate the evaporation vapor.

3. The continuous coating apparatus of claim 1, wherein the vapor guide unit encloses at least a portion of the levitation-heating unit, so that the evaporation vapor generated from the inside thereof is guided and sprayed to the coating target.

4. The continuous coating apparatus of claim 3, wherein the vapor guide unit comprises:
   an evaporation vapor generation section the liquid coating material supplied therein and enclosing the levitation-heating unit, the coating material supply pipe provided in the liquid coating material supply unit being connected to one of an upper portion and a lower portion of the evaporation vapor generation section; and,
   at least an evaporation vapor nozzle section of a vapor guide section connected to the evaporation vapor generation section, and the evaporation vapor nozzle section connected to the evaporation vapor generation section or the vapor guide section;

wherein the evaporation vapor nozzle section including an evaporation vapor spray opening formed in correspondence with the width of the coating target.

5. The continuous coating apparatus of claim 4, wherein,
the evaporation vapor generation section and the vapor guide section of the vapor guide unit are provided in a tube form,
the evaporation vapor generation section is made of an electrically nonconductive material, and
the second heating unit is provided for the vapor guide section and the evaporation vapor nozzle section.

6. The continuous coating apparatus of claim 5, wherein the levitation-heating unit comprises one or more electromagnetic coils which levitate and heat the supplied coating material by an electromagnetic force and generate the evaporation vapor and wherein the heating unit disposed at the vapor guide unit is spaced apart by a distance equal to at least once the inner diameter or a distance equal to at least twice the inner radius of the one or more electromagnetic coils disposed to be adjacent thereto and wound.

7. The continuous coating apparatus of claim 4, further comprising a filter member disposed in the vicinity of the evaporation vapor spray opening provided in the evaporation vapor nozzle section so that the evaporation vapor passes therethrough, the filter member being made in a fabric structure by using a heat-resistant metal or ceramic material.

8. The continuous coating apparatus of claim 1, further comprising additional heating units which are respectively connected to the crucible and the supply pipe provided in the liquid coating material supply unit.

9. The continuous coating apparatus of claim 1, wherein the coating target is provided in a form of a substrate continuously passing through the vacuum chamber, and the liquid coating material is provided in a form of a molten metal.

10. The continuous coating apparatus of claim 1, wherein the liquid coating material is supplied to the levitation-heating unit by a pressure differential between the crucible disposed outside of the vacuum chamber unit and the levitation-heating unit disposed inside of the vacuum chamber unit.

11. A continuous coating apparatus comprising:
a vacuum chamber unit through which a coating target passes;
a levitation-heating unit disposed in the vacuum chamber unit and generating an evaporation vapor by vaporizing a supplied coating material;
a liquid coating material supply unit comprising:
a crucible disposed outside of the vacuum chamber unit and storing the liquid coating material;
a coating material supply pipe wherein the coating material supply pipe is connected between the crucible and the levitation-heating unit so that the liquid coating material is supplied to at least one of an upper portion and a lower portion of the levitation-heating unit disposed inside the vacuum chamber unit, and communicating with the crucible disposed outside of the vacuum chamber unit;
a vapor guide unit connected to the liquid coating material supply unit inside the vacuum chamber unit and enclosing at least a portion of the levitation-heating unit, so that the evaporation vapor generated from the inside thereof is guided to and sprayed to the coating target; and
a second heating unit provided in the vapor guide unit in addition to the levitation-heating unit.

\* \* \* \* \*